United States Patent
Kumar et al.

(10) Patent No.: US 10,691,540 B2
(45) Date of Patent: Jun. 23, 2020

(54) SOFT CHIP-KILL RECOVERY FOR MULTIPLE WORDLINES FAILURE

(71) Applicant: SK Hynix Inc., Gyeonggi-do (KR)

(72) Inventors: Naveen Kumar, San Jose, CA (US); Aman Bhatia, San Jose, CA (US); Chenrong Xiong, San Jose, CA (US); Yu Cai, San Jose, CA (US); Fan Zhang, Fremont, CA (US)

(73) Assignee: SK Hynix Inc., Gyeonggi-do (KR)

( * ) Notice: Subject to any disclaimer, the term of this patent is extended or adjusted under 35 U.S.C. 154(b) by 79 days.

(21) Appl. No.: 16/151,053

(22) Filed: Oct. 3, 2018

(65) Prior Publication Data

US 2019/0155688 A1    May 23, 2019

Related U.S. Application Data

(60) Provisional application No. 62/589,461, filed on Nov. 21, 2017.

(51) Int. Cl.
| | | |
|---|---|---|
| *G06F 11/10* | (2006.01) | |
| *G11C 29/52* | (2006.01) | |
| *H03M 13/37* | (2006.01) | |
| *H03M 13/45* | (2006.01) | |
| *H03M 13/11* | (2006.01) | |

(Continued)

(52) U.S. Cl.
CPC ...... *G06F 11/1076* (2013.01); *G06F 11/1012* (2013.01); *G11C 29/52* (2013.01); *H03M 13/1111* (2013.01); *H03M 13/13* (2013.01); *H03M 13/293* (2013.01); *H03M 13/2906* (2013.01); *H03M 13/2948* (2013.01);

(Continued)

(58) Field of Classification Search
CPC .......... G06F 11/1076; H03M 13/1111; H03M 13/13; H03M 13/2948; H03M 13/2906; H03M 13/293; H03M 13/45; G11C 29/52; G11C 2029/0411
See application file for complete search history.

(56) References Cited

U.S. PATENT DOCUMENTS

2008/0244359 A1 * 10/2008 Li ..................... H03M 13/1102
                                                              714/758
2015/0293813 A1   10/2015 Lin
(Continued)

OTHER PUBLICATIONS

R. Lucas, M. Bossert and M. Breitbach, "On iterative soft-decision decoding of linear binary block codes and product codes," in IEEE Journal on Selected Areas in Communications, vol. 16, No. 2, pp. 276-296, Feb. 1998. (Year: 1998).*

(Continued)

*Primary Examiner* — Cynthia Britt
(74) *Attorney, Agent, or Firm* — Kilpatrick Townsend Stockton LLP

(57) ABSTRACT

Techniques are described for memory writes and reads according to a chip-kill scheme that allows recovery of multiple failed wordlines. In an example, when reading data from a superblock of the memory, where the decoding of multiple wordlines failed, a computer system schedules the decoding of failed wordlines based on quantity of bit errors and updates soft information based on convergence or divergence of the scheduled decoding. Such a computer system significantly reduces decoding failures associated with data reads from the memory and allows improved data retention in the memory.

20 Claims, 8 Drawing Sheets

(51) Int. Cl.
   *H03M 13/13*    (2006.01)
   *H03M 13/29*    (2006.01)
   *G11C 29/04*    (2006.01)

(52) U.S. Cl.
   CPC ....... *H03M 13/3746* (2013.01); *H03M 13/45* (2013.01); *G11C 2029/0411* (2013.01)

(56) References Cited

U.S. PATENT DOCUMENTS

2016/0210190 A1*   7/2016   Ha .................... G06F 11/1068
2016/0306694 A1*  10/2016   Tai ................... G06F 11/108
2017/0031751 A1    2/2017   Baek
2019/0155686 A1*   5/2019   Kumar ............... G06F 11/1068

OTHER PUBLICATIONS

Y. Cai, S. Ghose, E. F. Haratsch, Y. Luo and O. Mutlu, "Error Characterization, Mitigation, and Recovery in Flash-Memory-Based Solid-State Drives," in Proceedings of the IEEE, vol. 105, No. 9, pp. 1666-1704, Sep. 2017 (Year: 2017).*

Daesung Kim, Jinho Choi and Jeongseok Ha, "On the soft information extraction from hard-decision outputs in MLC NAND flash memory," 2012 IEEE Global Communications Conference (GLOBECOM), Anaheim, CA, 2012, pp. 3208-3213. (Year: 2012).*

\* cited by examiner

SOFT CHIP-KILL RECOVERY FOR MULTIPLE WORDLINES FAILURE

CROSS-REFERENCES TO RELATED APPLICATIONS

The present application claims priority to Provisional Application No. 62/589,461 entitled "SOFT CHIP-KILL RECOVERY FOR MULTIPLE WORDLINES FAILURE," filed Nov. 21, 2017, which is assigned to the assignee hereof and expressly incorporated by reference herein in its entirety.

BACKGROUND

Data integrity is an important feature for any data storage device and data transmission. Use of strong error-correction codes (ECCs) is recommended for various types of data storage devices include NAND flash memory devices. ECCs are also frequently used during the process of data transmission.

Error correcting code (ECC) refers to codes that add redundant data, or parity data, to a message, such that the message can be recovered by a receiver even when a number of errors were introduced, either during the process of transmission, or storage. In general, the ECC can correct the errors up to the capability of the code being used. Low-density parity-check code (LDPC) is an example of ECC.

In a data storage device, such as a NAND flash memory device, data can be written to and read from wordlines of the data storage device. Wordline failures can be common in NAND. In existing systems, there are various techniques to handle these failures. Typically, the data bits are decoded with a decoder, such as an LDPC decoder. If the decoding fails, a chip-kill is used. Chip-kill refers to an ECC computer memory technology that protects against memory failures.

In existing systems, a chip-kill involves an XOR over all data in a superblock. However, if there are two wordlines failing, recovering data from hard information obtained from the channel becomes challenging. In this scenario, soft information can be obtained from the channel and bits can be flipped at locations for the failed wordlines where soft information provides strong information about the bit. Errors happening at weaker soft information can be corrected through the LDPC decoder. However, two wordlines failing due to physical defect where no channel information can be obtained cannot be corrected using the existing schemes for chip-kill. Simply, the decoding fails and data written to the data storage device may not be recoverable.

BRIEF SUMMARY

Techniques are described for memory writes and reads according to a chip-kill scheme that allows recovery of multiple failed wordlines. In an example, a computer system decodes, in a decoding iteration, codewords from a superblock. The superblock includes a first block on a first memory die, a second block on a second memory die, and a third block on a third memory die. The first block stores a first codeword of the codewords. The second block stores a second codeword of the codewords. The third block stores XOR parity bits for the codewords. The computer system determines that the decoding of at least the first codeword and the second codeword failed in the decoding iteration based on a first number of error bits associated with the first codeword and on a second number of error bits associated with the second codeword. The decoding of the first codeword in the decoding iteration is based on first soft information associated with the first codeword. The decoding of the second codeword in the decoding iteration is based on second soft information associated with the second codeword. The computer system selects to decode, in a next decoding iteration, the first codeword prior to decoding the second codeword in the next decoding iteration based on the first number of error bits and the second number of error bits. The computer system generates, based on the first codeword being selected, updated first soft information associated with the first codeword. The updated first soft information is generated by updating the first soft information based on the second soft information and the XOR parity bits. The computer system decodes, in the next decoding iteration, the first codeword based on the updated first soft information.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
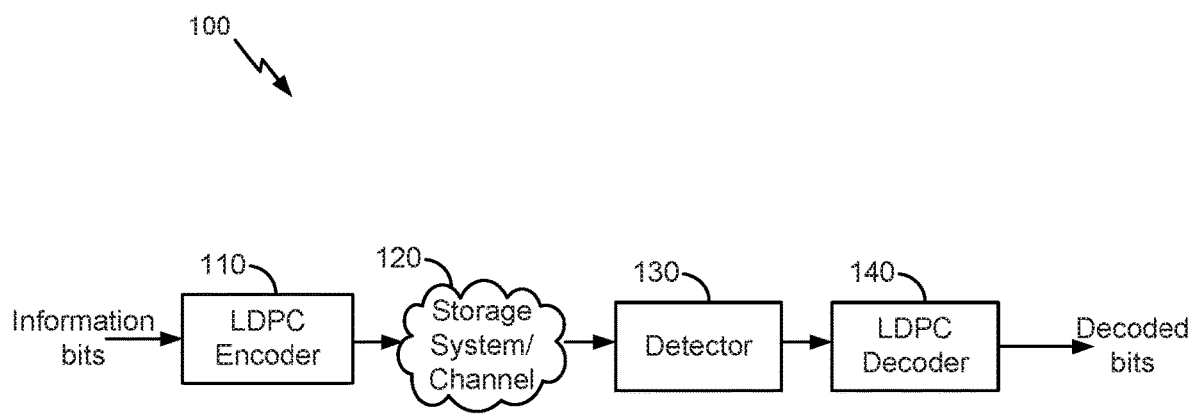
FIG. 1 illustrates an example high level block diagram of an error correcting system, in accordance with certain embodiments of the present disclosure.

Embodiments of the present disclosure involve improving memory reads of a computer system. In an example, data is written to a storage device of the computer system, such as to a NAND flash memory device. The data is read from memory based on a decoding of bits stored in wordlines and bitlines of the memory. Wordline and/or bitline failures are detected and soft information is updated based on chip-kill parity for additional decoding of the failed wordlines and/or bitlines.

For example, if there are multiple wordlines failing on a same stripe of chip-kill, iterative decoding can be used to recover the failed wordlines. In particular, the failed wordlines are detected from a current decoding iteration. For a next decoding iteration, a schedule for decoding the failed wordlines is generated based on the number of error bits in the failed wordlines from the current decoding iteration. The schedule sets an order or a sequence by which the failed wordlines should be decoded. For instance, the failed wordline that has the smallest number of error bits is scheduled first, followed by another failed wordline having the next smallest number of error bits, and so on and so forth. In the next decoding iteration, upon the decoding of a failed wordline, a determination is made as to whether its decoding converged or diverged. Decoding convergence occurs when the number of error bits in the failed wordline has decreased. Conversely, decoding divergence occurs when the number of error bits in the failed wordline has increased. If decoding convergence occurs, the soft information available from the next decoding iteration about the failed wordline is used along with XOR parity information to update the soft information of another failed wordline scheduled for subsequent decoding in the next decoding iteration. In contrast, if decoding divergence occurs, the soft information available from the next decoding iteration about the failed wordline is erased and not used for the decoding of the other failed wordline in the next decoding iteration. The decoding is iteratively repeated across the different failed wordlines for a number of iterations or until the decoding of all of the wordlines is successful.

To illustrate, consider an example of a NAND device. In this example, "K" wordlines belong to a same chip-kill stripe of a superblock. These wordlines store low-density parity-check (LDPC codewords). All wordlines are decoded successfully with an LDPC decoder except "L" wordlines. For these "L" wordlines LDPC decoding, soft information is updated using the LDPC decoder. "L1" codewords have a less number of errors after decoding compared to channel errors. "L2" codewords (where "L2=L−L1") has a larger number of errors after LDPC decoding compared to channel errors. This can be detected from the number of unsatisfied checks before and after decoding. Now a soft information update for these failed "L" codewords is updated using chip-kill parity. While updating soft information, channel information is used for those "L2" codewords and LDPC output soft information is used for those "L1" codewords. In this way, corrupted soft information from the LDPC decoder is avoided during soft information update using chip-kill parity. This LDPC decoding and soft information update with chip-kill parity can be done iteratively.

Embodiments of the present disclosure provide various technological improvement to memory technology, including to data reads from the memory and data retention in the memory. In particular, when multiple wordlines failed and due to a physical defect of the memory and when no channel information can be obtained, existing systems cannot recover the data from the memory. In comparison here, soft information is generated and is updated based on the scheduling of the failed wordlines and the chip-kill parity, allowing for the data recovery. In addition, even when existing systems recover the data (e.g., based on availability of soft information), by using the scheduling and soft information updates, the embodiments provide significant performance gains, such as more than an order of magnitude of code failure rate (CFR) improvement. Furthermore, chip-kill parity is typically stored for all blocks in a superblock. Hence, in existing systems, the retention life of the superblock equates to the shortest retention life of the blocks and this superblock is recycled upon a worsening of the bit error rate (BER) in the particular block despite that other blocks may still have a good BER performance. In contrast here, no such recycling may be needed because the data can still be recovered.

In the interest of clarity of explanation, embodiments of the present disclosure are described in connection with LDPC codewords stored in wordlines. Nonetheless, the embodiments similarly apply to other types of ECC codewords. In particular, a targeted type(s) of ECC codeword can be used by implementing equivalent ECC encoder(s) and decoder(s). In also the interest of clarity of explanation, the embodiments are described in connection with failed wordlines. Nonetheless, the embodiments similarly apply to failed bitlines.

Generally, a memory includes a superblock that, in turn, includes a plurality of blocks each of which is on a memory die. A first block stores a first codeword, a second block stores a second codeword, and so on and so forth. The last block stores XOR parity bits (e.g., chip-kill parity). Upon completion of a first decoding iteration, a determination is made that at least the decoding of the first codeword and the second codeword failed. For example, the number of error bits in each of these codewords (e.g., in the corresponding decoded codewords) may be higher than the error correction capability of the decoder. Prior to a second, next decoding iteration, a determination is made that the decoding of these two failed codewords in the second decoding iteration should be performed for the first codeword prior to the second codeword based on the first codeword being associated with a lower number of error bits. The soft information about the first codeword (where this information is available as an output of the first decoding iteration) is updated based on the scheduling set for the second decoding iteration. In particular, this soft information is updated based on the XOR parity bits and the soft information about the second codeword (also available as an output of the first decoding iteration). Accordingly, in the second decoding iteration, the first codeword is decoded based on its updated soft information. Thereafter, if the number of error bits associated with this codeword (e.g., in the decoded codeword) decreases in the second decoding iteration relative to the first decoding iteration, a decoding convergence has occurred. Otherwise, a decoding divergence has occurred. If the decoding convergence occurred, the soft information about this first codeword (available as an output of the second decoding iteration) is used, along with the XOR parity bits, to update the soft information about the second codeword (available as an output of the first decoding iteration). This scheduling and soft information update is iteratively repeated across the different failed codewords for a number of iterations or until all codewords are successfully decoded. Once the decoding iterations are complete, the decoded codewords are output as the read data from the memory.

In one example, the codewords and XOR parity bits belong to same stripe of wordlines of the superblock. The codewords are LDPC codewords and the decoding uses a LDPC decoder. log-likelihood ratios (LLRs) are used for the soft information. The number of error bits of an LDPC codeword is indicated by the number of unsatisfied check nodes associated with the LDPC codeword.

FIG. 1 illustrates an example high level block diagram of an error correcting system 100, in accordance with certain embodiments of the present disclosure. In the example, LDPC codes are described in connection with data storage. However, the embodiments of the present disclosure are not limited as such. Instead, the embodiments similarly apply to other usage of LDPC codes including, for example, data transmission.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to number of non-zero values in a specific row of the parity-check matrix H. In general, if column weights of all of the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

The LDPC codes are also described according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 110 receives information bits that include data which is desired to be stored in a storage system 120. LDPC encoded data is output by the LDPC encoder 110 and is written to the storage 120.

In various embodiments, the storage 120 may include a variety of storage types or media such as (e.g., magnetic) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 130 receives data from the storage system 120. The received data may include some noise or errors. The detector 130 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how sure or certain the detector is in that decision (e.g., a large magnitude indicates a high reliability or certainty).

The decision and/or reliability information is passed to a LDPC decoder 140 which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 140 are passed to the appropriate entity (e.g., the user or application which requested it). With proper encoding and decoding, the information bits match the decoded bits.

In various embodiments, the system shown may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable or bit nodes correspond to elements of the codeword and the other set of nodes, e.g., check nodes, correspond to the set of parity-check constraints satisfied by the codeword. Typically the edge connections are chosen at random. The error correction capability of an LDPC code is improved if cycles of short length are avoided in the graph. In a (r,c) regular code, each of the n variable nodes (V1, V2, . . . , Vn) has connections to r check nodes and each of the m check nodes (C1, C2, . . . , Cm) has connections to c bit nodes. In an irregular LDPC code, the check node degree is not uniform. Similarly the variable node degree is not uniform. In QC-LDPC codes, the parity-check matrix H is structured into blocks of p×p matrices such that a bit in a block participates in only one check equation in the block, and each check equation in the block involves only one bit from the block. In QC-LDPC codes, a cyclic shift of a codeword by p results in another codeword. Here p is the size of square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

A message passing algorithm is generally used to decode LDPC codes. Several variations of the message passing algorithm exist in the art, such as min-sum (MS) algorithm, sum-product algorithm (SPA) or the like. Message passing uses a network of variable nodes and check nodes. The connections between variable nodes and check nodes are described by and correspond to the values of the parity-check matrix.

In an example, a hard decision message passing algorithm may be performed. In a first step, each of the variable nodes sends a message to one or more check nodes that are connected to it. In this case, the message is a value that each of the variable nodes believes to be its correct value.

In the second step, each of the check nodes calculates a response to send to the variable nodes that are connected to it using the information that it previously received from the variable nodes. This step can be referred as the check node update (CNU). The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, the decoding algorithm declares that a correct codeword is found and it terminates. If a correct codeword is not found, the iterations continue with another update from the variable nodes using the messages that they received from the check nodes to decide if the bit at their position should be a zero or a one by a majority rule. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword. It should be noted that a soft-decision decoder works similarly, however, each of the messages that are passed among check nodes and variable nodes, also include reliability of each bit.

In another example, a soft message passing algorithm may be performed. In this example, $L(q_{ij})$ represents a message that is sent by variable node $v_i$ to check node $c_j$; $L(r_{ji})$ represents the message sent by check node $c_j$ to variable node $v_i$; and $L(c_i)$ represents initial LLR value for each variable node $v_i$. Variable node processing for each $L(q_{ij})$ can be done through the following steps:
(1) Read $L(c_i)$ and $L(r_{ji})$ from memory.
(2) Calculate $L(Qi\text{-sum})=L(c_i)+\text{Scaling Factor}*\Sigma_{j'\in c_i}L(r_{ij})$.
(3) Calculate each $L(Qi\text{-sum})-L(r_{ij})$.
(4) Output $L(Qi\text{-sum})$ and write back to memory.
(5) If this is not the last column of the memory, go to Step 1 and increment i by one.
(6) Compute parity-check-sums (e.g., syndrome), if they are all equal to zero, the number of iterations reaches a threshold and the parity-check-sums are greater than another threshold, or the number of iterations equals a maximum limit, stop; otherwise, perform check node processing.

Check node processing for each $L(r_{ji})$ can be performed as follows:
(1) Read one row of $q_{ij}$ from memory.
(2) Calculate $L(Rj\text{-sum})$ as follows:

$$L(Rj-\text{sum}) = \left(\prod_{i'\in R_j}\alpha_{i'j}\right)\phi\left(\sum_{i'\in Rj}\phi(\beta_{i'j})\right)$$

$$\alpha_{ij} = \text{sign}(L(q_{ij})), \beta_{ij} = |L(q_{ij})|,$$

$$\phi(x) = -\log\left(\tanh\left(\frac{x}{2}\right)\right) = \log\left(\frac{e^x+1}{e^x-1}\right)$$

(3) Calculate the individual $L(r_{ji})=(\Pi_{i'\in R_{ji}}\alpha_{i'j})\emptyset(\Sigma_{i'\in R_{ji}}\emptyset(\beta_{i'j}))$ for check nodes.
(4) Write back $L(r_{ji})$ to memory.
(5) If this is not the last row of memory, then go to the first step and increment j by one.

Figure 2:
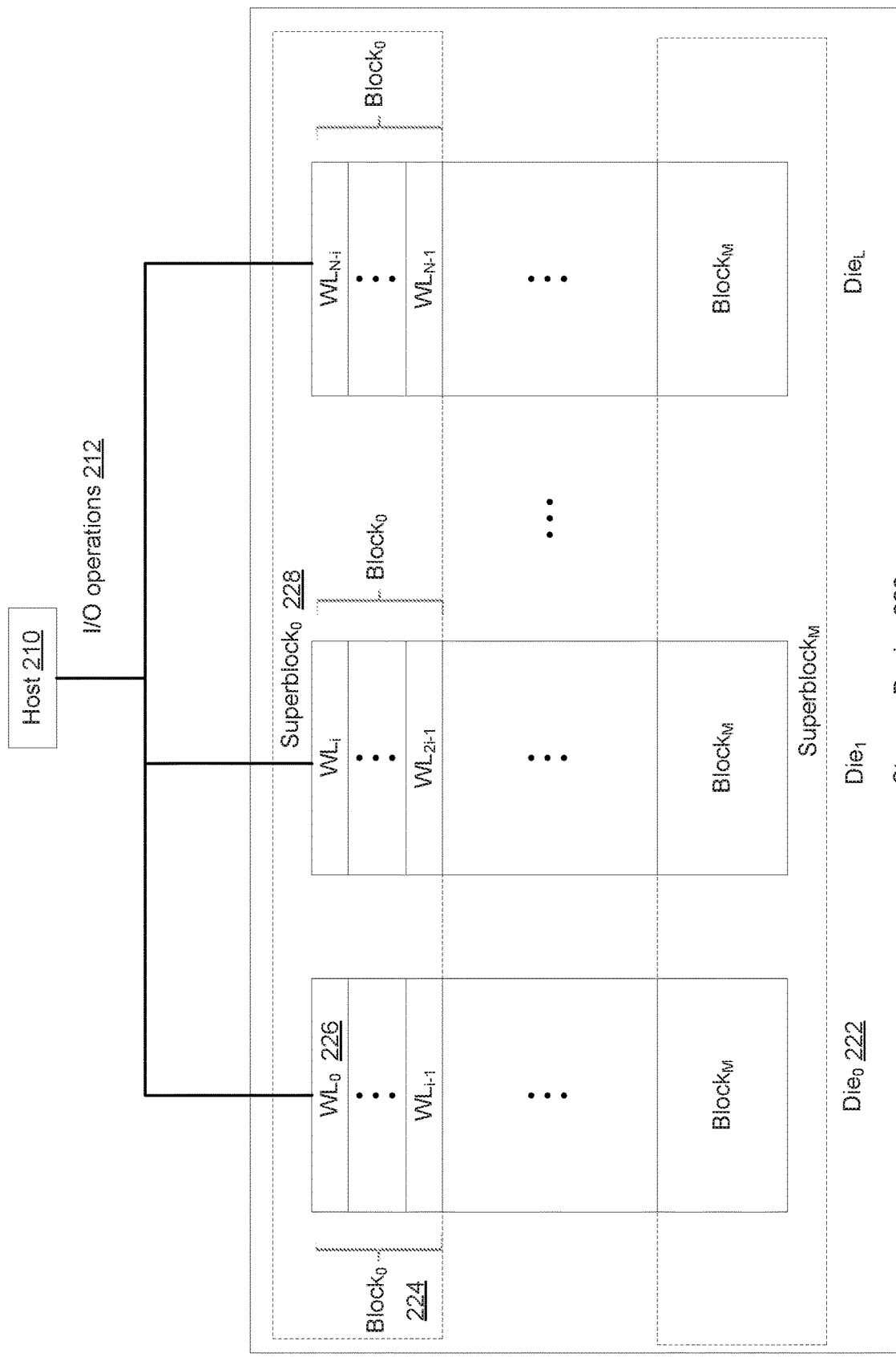
FIG. 2 illustrates an example of a computer system that includes a host and a storage device, in accordance with certain embodiments of the present disclosure.

FIG. 2 illustrates an example of a computer system that includes a host 210 and a storage device 220, in accordance with certain embodiments of the present disclosure. The host 210 performs I/O operations 212 including writing data to the storage device 220 and reading data from the storage device 220. In an example, writing the data includes encoding the data with one or more LDPC encoders (not shown in FIG. 2) to generate LDPC codewords that are stored in the storage device 220. Reading the data includes decoding the LDPC codewords with one or more LDPC decoders (not shown in FIG. 2) to output decoded data from the storage device 220. The encoding and decoding (e.g., the LDPC encoder(s) and decoder(s)) are part of an ECC system that can be implemented between the host 210 and the storage device 220.

In an example, the storage device 220 includes a number of memory dies 222 (this number is shown as "L" in FIG. 2). In turn, each memory die 222 includes a number of blocks 224 (this number is shown as "M" in FIG. 2), each of which contains a number of wordlines 226 (this number is shown as "i" in FIG. 2). Superblock 228 are formed and each contains a block 224 from each die 222.

As illustrated, superblock "0" includes the blocks "0" across the different dies 222. Block "0" of die "0" and belonging to superblock "0" includes wordlines "0" through "i-1." Accordingly, superblock "0" contains "N" wordlines, illustrated as wordline "0" through wordline "N-1."

Each of the wordlines is configured to store a number of data bits, such as sixteen kilobytes of data. Within each superblock, wordline "0" through wordline "N-2" store LDPC codewords corresponding to the data written by the host 210 (e.g., information bits). Wordline "N-1" (e.g., the last wordline) stores chip-kill parity bits according to the embodiments of the present disclosure. Although the last wordline is illustrated, the chip-kill parity bits can be stored instead in any other wordline of the superblock. Generally, the superblock includes wordlines and an additional wordline (e.g., wordlines "0" through "N-2" and wordline "N-1"). The wordlines store LDPC codewords corresponding to the information bits. The additional wordline stores the chip-kill parity bits.

Figure 3:
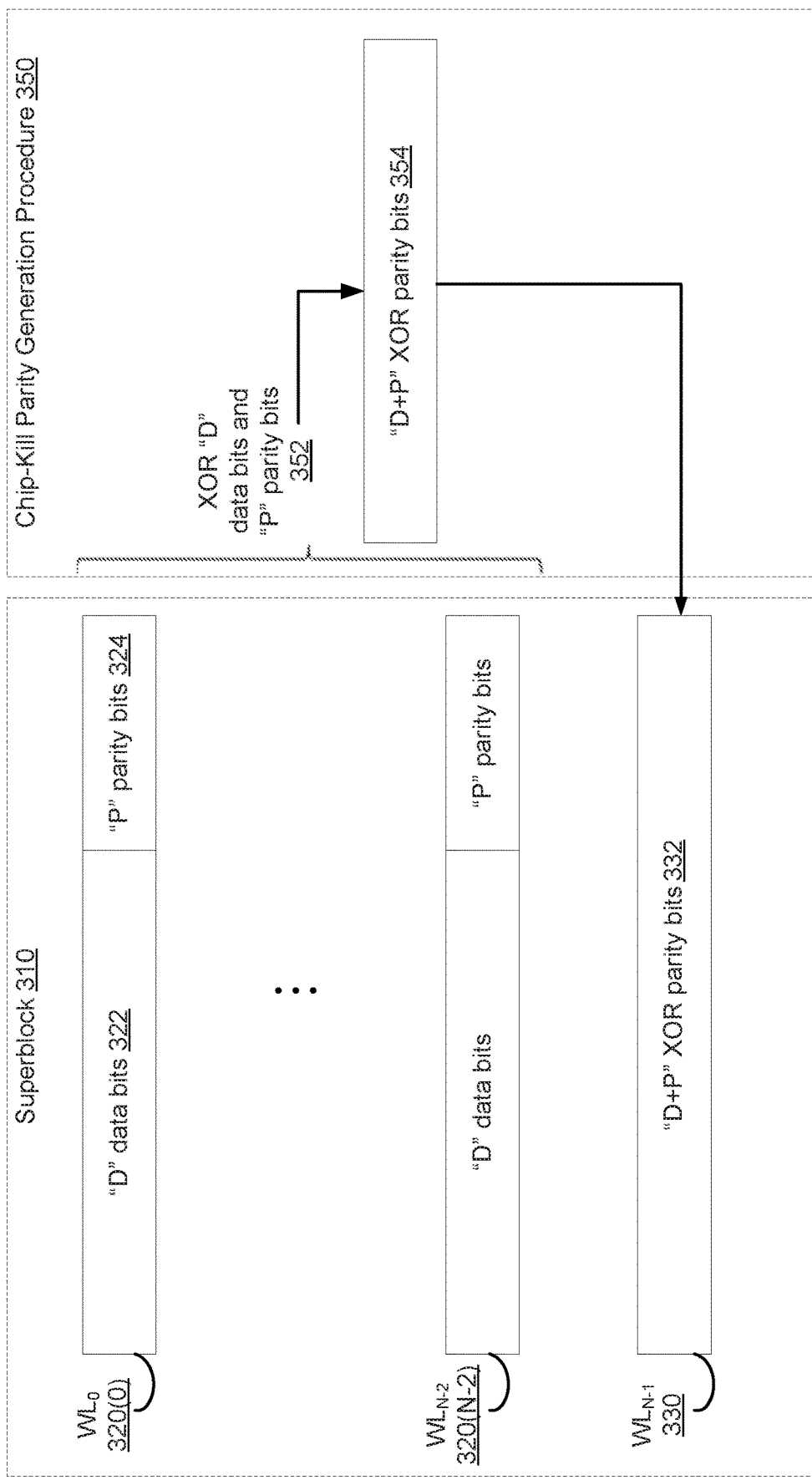
FIG. 3 illustrates an example of writing data to a superblock of a storage device, in accordance with certain embodiments of the present disclosure.

FIG. 3 illustrates an example of writing data to a superblock 310 of a storage device (such as to the superblock "0" of the storage device 220 of FIG. 2), in accordance with certain embodiments of the present disclosure. The superblock 310 is shown on the left side of FIG. 3. A procedure 350 for generating chip-kill parity is shown on the right side of FIG. 3.

As illustrated, the superblock 310 includes multiple wordlines that store LDPC codewords generated based on information bits. These wordlines are labeled 320(0) through 320(N-2) in FIG. 3. Each of the LDPC codewords includes "D" data bits 322 corresponding to a portion of the information bits, and "P" parity bits 324 that protect the "D" data bits. Each of "D" and "P" is a positive integer greater than or equal to one. Accordingly, each LDPC codeword has a length of "D+P" and can be generated by an LDPC encoder.

The superblock 310 also includes an additional wordline 330 (shown as wordline "N-1") that stores "D+P" XOR parity bits 332. In an example, the XOR parity bits 332 correspond to chip-kill parity generated according to the procedure 350.

To generate the XOR parity bits 332, the procedure 350 includes XOR operations. In an example, one or more XOR operations 352 are applied to the data portions and the parity portions of the wordlines of the superblock 310 (e.g., the "D" data bits stored in the wordlines 320(0) through 320(N-2) are XOR'ed and the "P" parity bits stored in the wordlines 320(0) through 320(N-2) are XOR'ed). This results in "D+P" XOR parity bits 354 that are then stored in the last wordline as 320(N-1) as a "D+P" the XOR parity bits 332.

In an example, the encoding and decoding of the data bits from the wordlines 320(0) through 320(N-2) is performed based on a stripe. The XOR parity bits 332 are computed across grouped wordlines of the stripe. For the decoding, if multiple wordlines fail on the same stripe, an iterative decoding technique based on scheduling, soft information updates, and the XOR parity bits 332 can be performed as further illustrated in the next figures.

Figure 4:
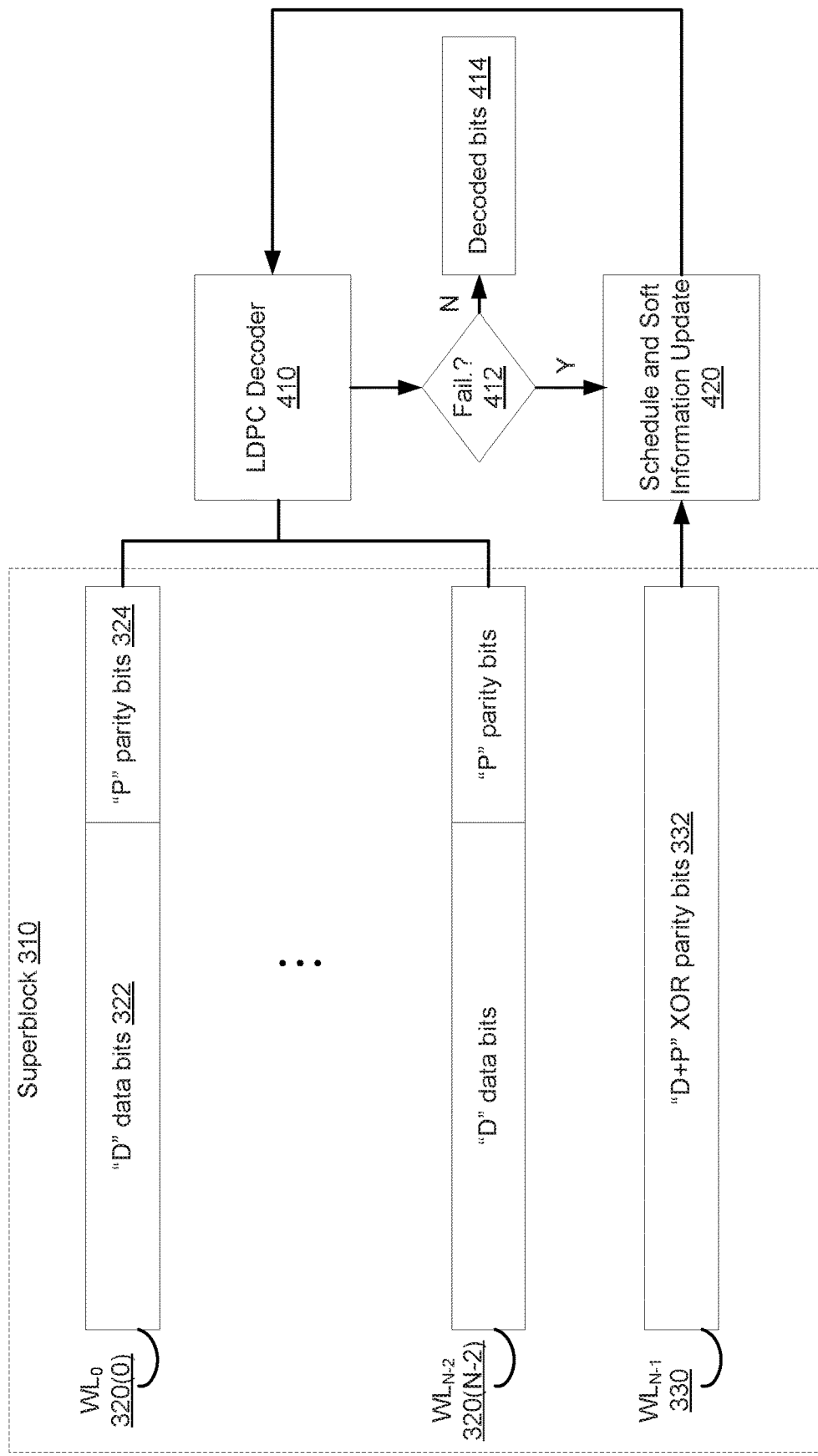
FIG. 4 illustrates an example of reading data from a superblock of a storage device, where the decoding of multiple wordlines has failed, in accordance with certain embodiments of the present disclosure.

FIG. 4 illustrates an example of reading data from the superblock 310, where the decoding of multiple wordlines has failed, in accordance with certain embodiments of the present disclosure. Reading the data includes decoding the data by a LDPC decoder 410 that relies on scheduling, soft information updates, and the XOR parity bits 332.

In an example, the LDPC decoder 410 decodes the LDPC codewords stored in the wordlines 320(0) through 320(N−2) of the superblock 310. The error correction capability of this LDPC decoder 410 is associated with the code rate "D/(D+P)" of these codewords. If multiple decoding failures 412 are detected, schedule and soft information update 420 and the XOR parity bits 332 are used to recover the failures. Otherwise, decoded bits 414 by the LDPC decoder 410 are an output from the superblock 310.

A decoding failure is detected when, for example, the number of error bits in a wordline (e.g., in the decoded bits of the LDPC codeword stored in the wordline) is larger than the error correction capability of the LDPC decoder 410. This wordline can be declared as a failed wordline. The number of error bits can be an output of the LDPC decoder 410 and corresponds, for example, to the number of unsatisfied check nodes.

If multiple failed wordline(s) are detected upon a completion of a decoding iteration (referred to herein as a "first decoding iteration" in the interest of clarity), the LDPC decoder 410 prepares for and proceeds to the next decoding iteration (referred to herein as a "second decoding iteration" in the interest of clarity), unless a maximum number of decoding iterations is reached. Upon completion of the first iteration, soft information and the numbers of error bits exist for each of the failed codewords. For instance, first soft information and second soft information are available for a first failed codeword and for a second failed codeword, respectively. In addition, a first number of error bits and a second number of error bits are available for the first failed codeword and for the second failed codeword, respectively.

The LDPC decoder 410 schedules the decoding of the failed codeword in the second decoding iteration based on the numbers of error bits. For instance, the failed codewords are ranked in an ascending order of error bits, where the first codeword is scheduled for decoding prior to the second failed codeword in the second decoding based on the first number of error bits being smaller than the second number of error bits.

In addition, the LDPC decoder 410 updates the soft information available from the first decoding iteration based on the schedule and the XOR parity bits 332. For instance, the first soft information about the first failed codeword is updated prior to the update of the second soft information about the second failed codeword given the schedule. To update the first soft information, the second soft information (as available from the first decoding iteration) is used along with the XOR parity bits 332. Various techniques are available for this update. In one example technique, each of the first soft information and the second soft information includes LLRs. The XOR parity bits 332 also have soft information (e.g., LLRs set based on the values of these bits). In this example, the LLRs of the second failed codeword and the LLRs of the XOR parity bits are weighted and combined (e.g., summed), along with the LLRs of the first failed codeword. In another example technique, the LLRs of the first failed codeword are erased (e.g., set to zero), and replaced with the weighted and combined LLRs of the second failed codeword and XOR parity bits. In yet another example technique, hard information about the XOR parity bits 332 (e.g., the bit values) is used instead of their soft information. In this example, the LLRs of the second failed codeword (and, optionally, of the first failed codeword if no erasure is used) are mapped to a set of binary values. The XOR parity bits are also mapped to a set of binary values. The two sets are used to retrieve the update to the first soft information from a look-up table, where this look-up table may store predefined updates and their associations with different value sets. The weights and/or table can be empirically defined based on lab simulations and/or lab measurements of decoding performances.

Regardless of what update technique is actually used, the updated first soft information becomes an input to the LDPC decoder when decoding the first failed codeword in the second decoding iteration. Upon this addition decoding of the first failed codeword, the LDPC decoder 410 determines whether the first number of error bits increased or decreased to detect the occurrence of a decoding convergence or a decoding divergence.

If the decoding convergence is detected, the LDPC decoder 410 proceeds to decoding the second failed codeword in the second decoding iteration according to the schedule. Here, the decoding is similar to what was performed for the first failed codeword, except that the second soft information available for the second failed codeword from the first iteration decoding is updated based on the XOR parity bits 332 and soft information about the first failed codeword. This soft information about the first failed codeword is an output of the LDPC decoder 410 upon the decoding of the first failed codeword in the second decoding iteration.

If the decoding divergence is detected, the LDPC decoder 410 also proceeds to decoding the second failed codeword in the second decoding iteration according to the schedule. However, this decoding does not use the soft information about the first failed codeword from the second decoding iteration. Instead, the LDPC decoder 410 erases this soft information and reverts back to using the first soft information available from the first decoding iteration about the first failed codeword because of the decoding divergence. Accordingly, the second soft information available for the second failed codeword from the first iteration decoding is updated based on the XOR parity bits 332 and the first soft information also available from the first decoding iteration about the first failed codeword.

Figure 5:
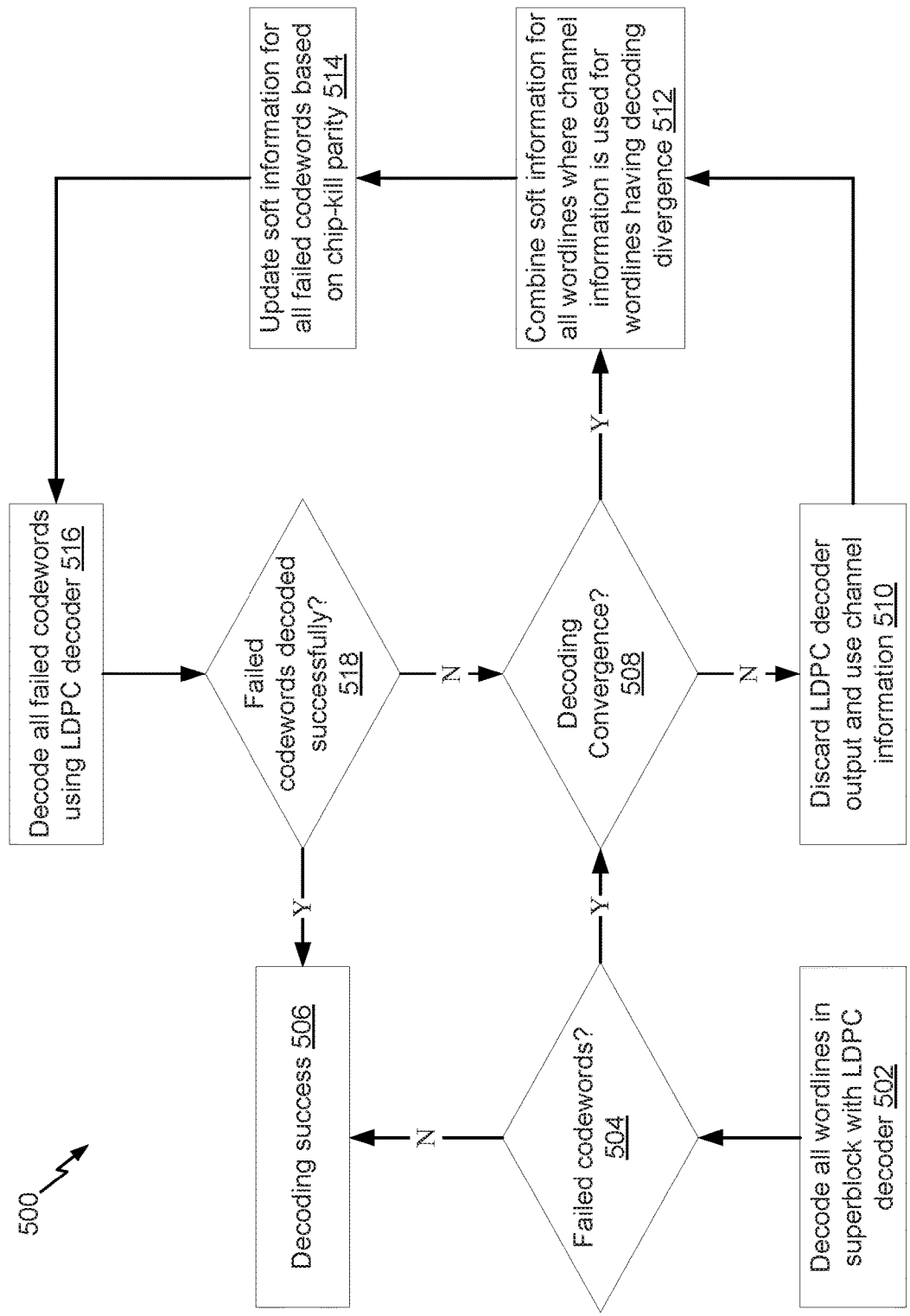
FIG. 5 illustrates an example flow for writing data to and reading data from a superblock of a storage device, in accordance with certain embodiments of the present disclosure.

FIG. 5 illustrates an example flow 500 for reading data from a superblock of a storage device, in accordance with certain embodiments of the present disclosure. A computer system is described as performing particular operations of the example flow 500. This computer system includes the storage device and an LDPC system, although any other ECC system can similarly be used. The LDPC system may have a specific hardware configuration to perform operations illustrated in the example flow 500, such as an LDPC decoder. Alternatively or additionally, the LDPC system may include generic hardware configured with specific instructions. In an example, the computer system includes one or more processors and one or more memories, including the data storage device. The memory(ies) stores computer-readable instructions to embody functionalities specific to the LDPC system. The instructions when executed by the processor(s) of the computer system result in performance of the operations. The instructions stored in the memory(ies) in conjunction with the underlying processor(s) represent a means for performing the operations.

Although the operations are illustrated in a particular order, other arrangements of the operations are possible and some of the operations may be skipped as it would be apparent to a person skilled in the art.

As illustrated, the example flow 500 starts at operation 502, where the computer system decodes all wordlines in a superblock with an LDPC decoder. For example, LDPC codewords stored in stripes of the superblock are input to the LDPC decoder and an output of this decoder are decoded LDPC codewords.

At operation 504, the computer system determines whether the decoding of any of the codewords failed. In an example, a decoding failure occurs when the number of error bits in a decoded codeword is larger than the error correction capability of the LDPC decoder. The computer system tracks the failed codewords and follows operation 508 to further decode them and recover the data bits. For the codewords that were successfully decoded, the computer system follows operation 506, declaring decoding success of these codewords and outputting the decoded data bits.

At operation 508, the computer system determines whether each of the failed codewords has a decoding convergence. In an example and for a failed codeword, the computer system tracks the number of error bits (as indicated by the unsatisfied check nodes used by the LDPC decoder) in the corresponding decoded codeword. This number is tracked over the different decoding iterations (e.g., whether the number increases or decreases between the decoding iterations). For the initial decoding iteration, the computer system can default to determining that there is a decoding convergence. For subsequent decoding iterations, the computer system determines that there is a decoding convergence for a failed codeword if its associated number of error bits decreases; otherwise, a decoding divergence is determined.

Upon detecting a decoding divergence for a failed codeword, the computer system follows operation 510, whereby the computer system discards the LDPC decoder's output for that failed codeword and uses channel information instead. In an example, the LDPC decoder's output includes soft information, such as LLR, for the corresponding decoded codeword. This soft information can be erased.

Upon detecting a decoding convergence for a failed codeword, the computer system follows operation 512, whereby the computer system combines soft information for all wordlines where channel information is used for wordlines having decoding divergences. In an example, the soft information associated with the failed codeword (e.g., as outputted from the LDPC decoder) is combined with other soft information associated with other failed codewords that also have decoding convergences. The combined soft information is usable to decode failed codewords that have decoding divergences.

At operation 514, the computer system updates soft information for all failed codewords based on chip-kill parity. In an example and for a failed codeword associated with first soft information, this first soft information is updated using the combined soft information and information about the XOR parity bits. Different types of updates are possible, including using a min-sum (MS) decoder or any other optimized soft decoder (e.g., sum-product algorithm (SPA)) as further illustrated in the next figures.

At operation 516, the computer system decodes all failed codewords using the LDPC decoder. In an example, the LDPC decoder performs an additional decoding iteration, where the updated soft information for each of the failed codeword from operation 514 is an input to the LDPC decoder.

At operation 518, the computer system determines whether the decoding of any of the failed codewords is successful. As explained herein above in connection with operation 504, a decoding success is determined upon the number of error bits being lower than the error correction capability of the LDPC decoder. If the decoding is successful, the computer system follows operation 506; otherwise, the computer system follows operation 508. The iterative process (e.g., operation 508 through 518) may be repeated until all codewords are decoded successfully or for a predetermined number of decoding iterations.

Figure 6:
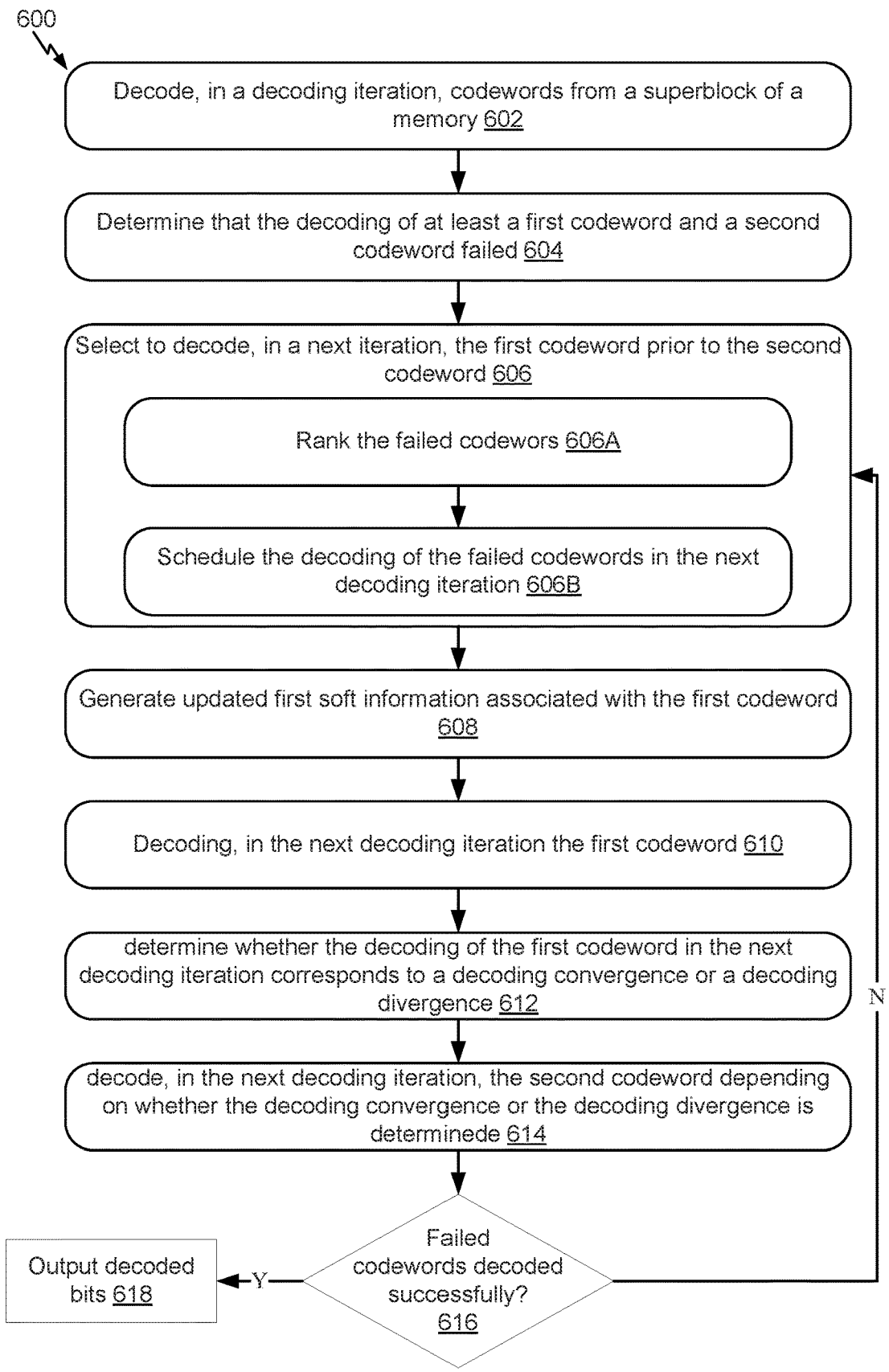
FIG. 6 illustrates an example flow for recovering multiple failed wordlines from a superblock, in accordance with certain embodiments of the present disclosure.

FIG. 6 illustrates an example flow 600 for recovering multiple failed wordlines from a superblock, in accordance with certain embodiments of the present disclosure. Operations of the example flow 600 can be implemented as sub-operations of the flow 500 of FIG. 5. In the interest of clarity of explanation, the example flow 600 is illustrated using a first codeword stored in a first wordline and a second codeword stored in a second wordline of a superblock, where these two codewords belong to a same stripe and are LDPC codewords. However, the superblock can contain a larger number of wordlines that store such LDPC codewords.

The example flow 600 starts at operation 602, where the computer system decodes, in a decoding iteration, codewords from a superblock of a memory. The superblock includes a first block on a first memory die, a second block on a second memory die, and a third block on a third memory die. The first block stores a first codeword of the codewords. The second block stores a second codeword of the codewords, The third block stores XOR parity bits for the codewords.

At operation 604, the computer system determines that the decoding of at least the first codeword and the second codeword failed in the decoding iteration based on a first number of error bits associated with the first codeword and on a second number of error bits associated with the second codeword. For instance, each of these number of errors is larger than the error correction capability of the LDPC decoder. The decoding of the first codeword in the decoding iteration is based on first soft information associated with the first codeword. The decoding of the second codeword in the decoding iteration is based on second soft information associated with the second codeword. The LDPC decoder outputs the first and second soft information from the decoding iteration and the information includes LLRs of the corresponding decoded codewords. The first and second codewords can be declared as failed codewords.

At operation 606, the computer system selects to decode, in a next decoding iteration, the first codeword prior to decoding the second codeword in the next decoding iteration based on the first number of error bits and the second number of error bits. In an example, this operation can include multiple sub-operations. At sub-operation 606A, the computer system ranks the failed codewords based on the corresponding number of errors. For instance, the computer system ranks the first codeword and the second codeword based on the first number of error bits and the second number of error bits from the decoding iteration. In particular, the computer system compares the first and second number of the error bits and, in the case when the first number of errors is smaller than the second number of errors, the first codeword is ranked higher than the second codeword, indicating that the first codeword should be decoded prior to the second codeword in the next decoding iteration. At sub-operation 606B, the computer system schedules the decoding, in the next decoding iteration, of the failed codewords based on the ranking. For instance, the computer system schedules the decoding, in the next decoding iteration, of the first codeword and the second codeword based on the ranking, where the first codeword is scheduled for decoding prior to the second codeword based on the first codeword being ranked higher. As further illustrated in connection with FIG. 7, the scheduling can select the order in which variable nodes are processed in a message passing algorithm, where these variable nodes correspond to failed codewords.

At operation 608, the computer system generates, based on the first codeword being selected, updated first soft information associated with the first codeword. In an example, the updated first soft information is generated by updating the first soft information based on the second soft information and the XOR parity bits. Different update techniques are possible as described in connection with FIG. 4, including techniques that erase the existing first soft information (e.g., available as an output of the LDPC decoder from the decoding iteration), techniques that do not erase the existing first soft information, techniques that combine the second soft information with soft information about the XOR parity bits, and techniques that rely on a table look-up and hard information about the XOR bits (e.g., a mapping of bits to a set of binary values). As further illustrated in connection with FIG. 7, a message passing algorithm can be used to update the soft information of the failed codewords, where these variable nodes correspond to failed codewords.

At operation 610, the computer system decodes, decoding, in the next decoding iteration, the first codeword based on the updated first soft information. For example, the updated first soft information is an output to the LDPC decoder. A corresponding output of the LDPC decoder is the decoded codeword corresponding to the first codeword.

At operation 612, the computer system determining whether the decoding of the first codeword in the next decoding iteration corresponds to a decoding convergence or a decoding divergence. In an example, the computer system tracks the first number of error bits in the decoded codeword that corresponds to the first codeword. The computer system also determines how this number changes between the decoding iteration and the next decoding iteration. If the number decreases, a decoding convergence is determined; otherwise, a decoding divergence is determined.

At operation 614, the computer system decodes, in the next decoding iteration, the second codeword depending on whether the decoding convergence or the decoding divergence is determined. If the decoding convergence is determined, the computer system accesses soft information associated with the first codeword and available upon the decoding in the next decoding iteration (e.g., as outputted from the LDPC decoder in the next decoding iteration). The computer system also generates updated second soft information associated with the second codeword by updating the second soft information based on the soft information associated with the first codeword and on the XOR parity bits. The computer system also decodes, in the next decoding iteration, the second codeword based on the updated second soft information.

If the decoding divergence is determined, the computer system generates updated second soft information associated with the second codeword by updating the second soft information based on the XOR parity bits and independently of soft information associated with the first codeword from the next decoding iteration. For instance, the computer system erases the soft information associated with the first codeword and available upon the decoding of the first codeword in the next decoding iteration (e.g., as outputted from the LDPC decoder in the next decoding iteration). The computer system also decodes, in the next decoding iteration, the second codeword based on the updated second soft information.

At operation 616, the computer system determines whether the failed codewords were decoded successfully in the next decoding iteration. In an example, the computer system tracks the successfully decoded codewords (that were previously failed) and outputs the decoded bits at operation 618. For the previously failed codewords that remain failing upon completion of the next decoding iteration, the computer system loops back to operation 606 to start another decoding iteration, unless a maximum number of decoding iterations is reached (in which case, the decoding of these codewords remain unsuccessful).

Figure 7:
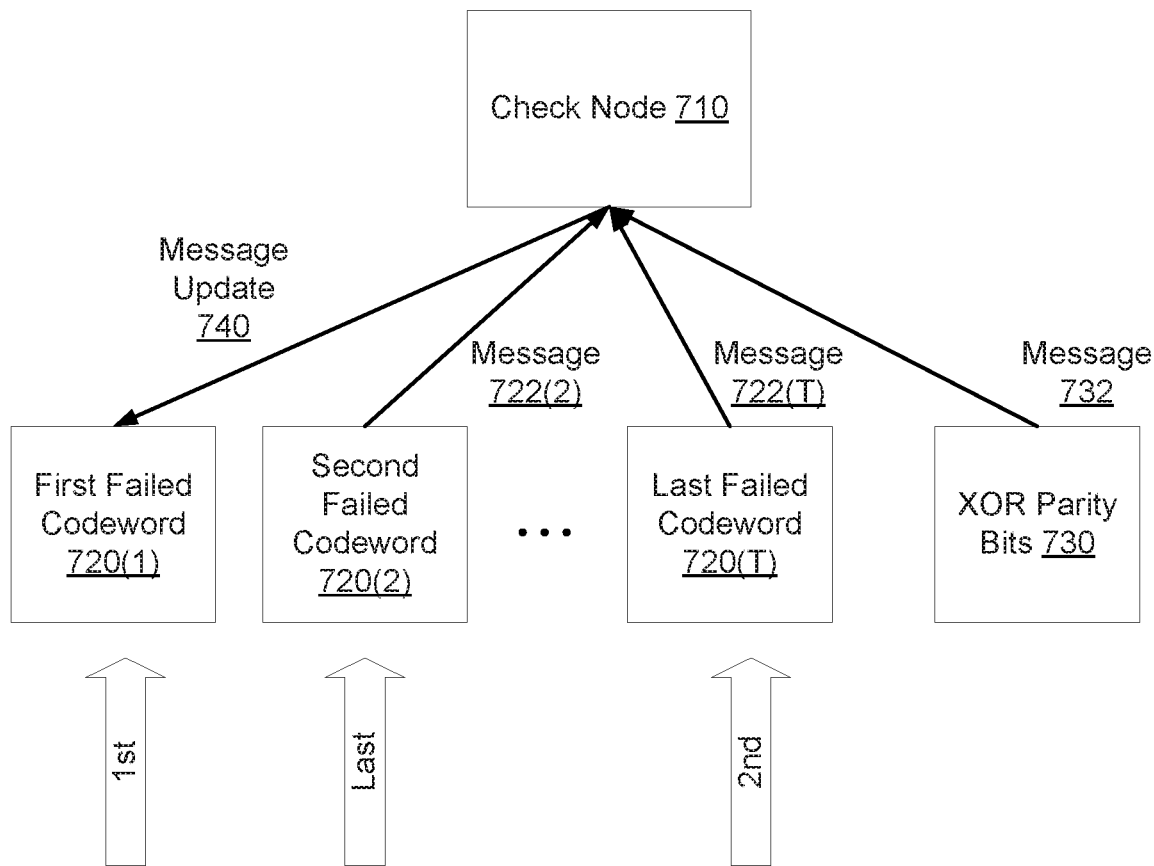
FIG. 7 illustrates an example use of a message passing algorithm for decoding failed codewords, where the use includes scheduling the decoding, in accordance with certain embodiments of the present disclosure.

FIG. 7 illustrates an example use of a message passing algorithm for decoding failed codewords, where the use includes scheduling the decoding, in accordance with certain embodiments of the present disclosure. As illustrated, a check node update (CNU) that uses a message passing algorithm, such as a min-sum (MS) or an SPA algorithm, can be used. Each failed codeword (shown as failed codewords 720(1), 720(2) through 720(T)) corresponds to a variable node connected. "XOR parity bits 730 also correspond to a variable node. Theses variable nodes are connected to a check node 710.

To decode the first failed codeword 720(1) with the decode, a message update 740 is passed from the check node 710 to the first decoder. This message update 740 is generated based on the message passing algorithm. In particular, a message is provided to the check node 710 from each of the remaining variable nodes corresponding to the remaining failed codewords 720(2) through 720(T) and XOR parity bits 730. Each message includes soft or hard information about the corresponding variable node. As such, a message 722(2) includes soft information or hard information about the second failed codeword 720(2). Similarly, a message 722(T) includes soft information or hard information about the last failed codeword 720(T). A message 732 includes soft information or hard information about the XOr parity bits 730. The message passing algorithm is used to generate the message update 740 from the messages 722(2) through 722(T) and the message 732.

When decoding the first failed codeword 720(1), the first decoder uses the message update 740. In addition, existing soft or hard information about the first codeword 720(1) can be erased. Alternatively, this existing information and the message update 740 can be each weighted and used in combination in the decoding of the first failed codeword 720(1).

This type of message passing and decoding is performed iteratively across multiple decoding iterations. At the start of a new decoding iteration, soft information about each of the failed codewords 720(1)-720(T) is available to the decoder from the previous decoding iteration. Further, the number of error bits in each of the corresponding decoded codewords is also available to the decoder from the previous decoding iterations. The decoder compares the numbers of error bits and schedules the decoding of the failed codewords 720(1)-720(T) in the new decoding iteration. As illustrated, the first failed codeword 720(1) is associated with the smallest number of error bits and, thus, is scheduled to be decoded first in the new decoding iteration. In comparison, the last failed codeword 720(T) has the next smallest number of error bits and, thus, is scheduled to be decoded second in the new decoding iteration. The second failed codeword 720(2) has the largest number of error bits and, thus, is scheduled to be decoded last in the new decoding iteration.

This type of scheduling impacts the decoding by intelligently updating the soft information for the failed codewords 720(1)-720(T) in the new decoding iteration dependently on decoding convergences and divergences. For instance, upon decoding the first failed codeword 720(1) in the next decoding iteration, the decoder determines whether its decoding converged or diverged depending on whether the associated number of error bits decreased or increased relative to the previous decoding iteration. Only if decoding convergence occurred for the first failed codeword 720(1), the decoder uses the soft information about this codeword 720(1) available from the new decoding iteration to update the soft information of the remaining failed codewords to be subsequently decoded in the new decoding iteration. In other words, the soft information available for the last failed codeword 720(7) (to be decoded next in the new decoding iteration) from the previous decoding iteration is updated based on the soft information available for the first failed codeword 720(1) available from the new decoding iteration. Similarly, when decoding the second failed codeword (to be decoded last in the new decoding iteration), its soft information available from the previous decoding iteration is updated with additional soft information for the other failed codewords, where this additional soft information includes soft information available from the new decoding iteration for failed codewords that have decoding convergences in the new decoding iteration.

Figure 8:
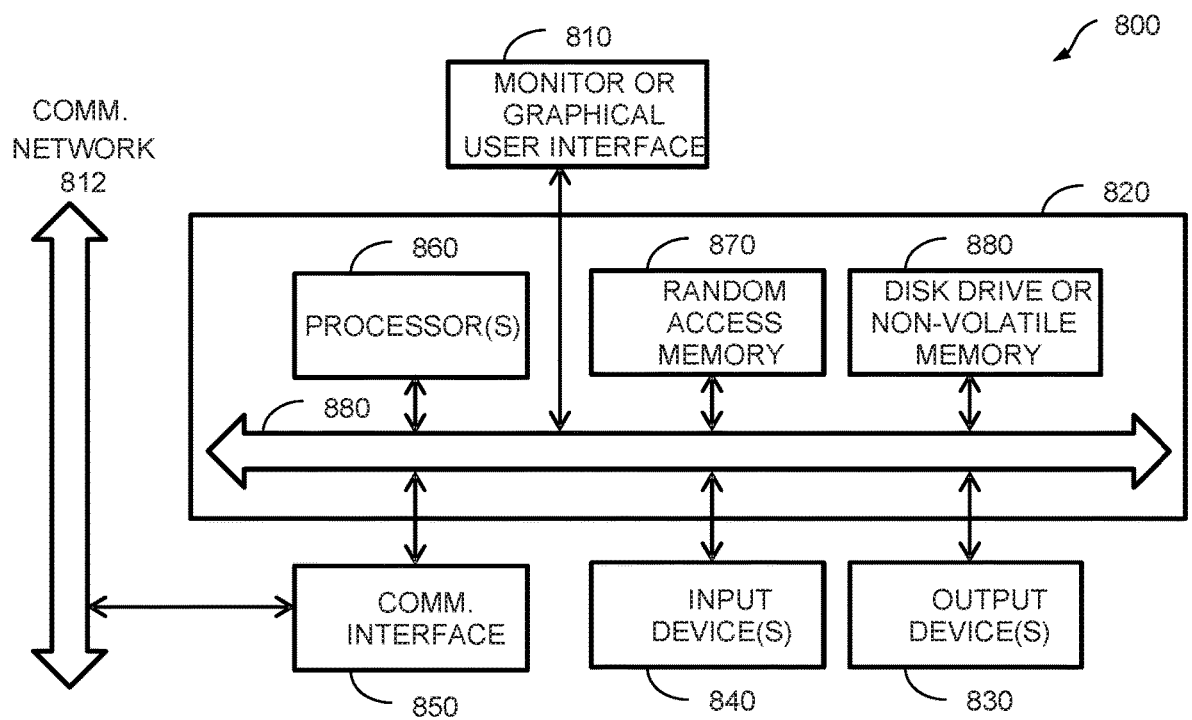
FIG. 8 illustrates one potential implementation of a system which may be used, according to certain embodiments of the present disclosure.

FIG. 8 illustrates one potential implementation of a system, which may be used, according to certain embodiments of the present disclosure. FIG. 8 is merely illustrative of an embodiment of the present disclosure and does not limit the scope of the disclosure as recited in the claims. In one embodiment, the system is a computer system 800 that typically includes a monitor 810, a computer 820, user output devices 830, user input devices 840, communications interface 850, and the like.

As shown in FIG. 8, the computer 820 may include a processor(s) 860 that communicates with a number of peripheral devices via a bus subsystem 890. These peripheral devices may include the user output devices 830, the user input devices 840, the communications interface 850, and a storage subsystem, such as random access memory (RAM) 870 and disk drive 880.

The user input devices 830 include all possible types of devices and mechanisms for inputting information to the computer system 820. These may include a keyboard, a keypad, a touch screen incorporated into the display, audio input devices such as voice recognition systems, microphones, and other types of input devices. In various embodiments, the user input devices 830 are typically embodied as a computer mouse, a trackball, a track pad, a joystick, wireless remote, drawing tablet, voice command system, eye tracking system, and the like. The user input devices 830 typically allow a user to select objects, icons, text and the like that appear on the monitor 810 via a command such as a click of a button or the like.

The user output devices 840 include all possible types of devices and mechanisms for outputting information from the computer 820. These may include a display (e.g., the monitor 810), non-visual displays such as audio output devices, etc.

The communications interface 850 provides an interface to other communication networks and devices 812. The communications interface 850 may serve as an interface for receiving data from and transmitting data to other systems. Embodiments of the communications interface 850 typically include an Ethernet card, a modem (telephone, satellite, cable, ISDN), (asynchronous) digital subscriber line (DSL) unit, FireWire interface, USB interface, and the like. For example, the communications interface 850 may be coupled to a computer network, to a FireWire bus, or the like. In other embodiments, the communications interfaces 850 may be physically integrated on the motherboard of the computer 820, and may be a software program, such as soft DSL, or the like.

In various embodiments, the computer system 800 may also include software that enables communications over a network such as the HTTP, TCP/IP, RTP/RTSP protocols, and the like. In alternative embodiments of the present disclosure, other communications software and transfer protocols may also be used, for example IPX, UDP or the like. In some embodiments, the computer 820 includes one or more Xeon microprocessors from Intel as the processor(s) 860. Further, one embodiment, the computer 820 includes a UNIX-based operating system.

The RAM 870 and the disk drive 880 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 870 and the disk drive 880 may be configured to store the basic programming and data constructs that provide the functionality of the present disclosure.

Software code modules and instructions that provide the functionality of the present disclosure may be stored in the RAM 870 and the disk drive 880. These software modules may be executed by the processor(s) 860. The RAM 870 and the disk drive 880 may also provide a repository for storing data used in accordance with the present disclosure.

The RAM 870 and the disk drive 880 may include a number of memories including a main random access memory (RAM) for storage of instructions and data during program execution and a read only memory (ROM) in which fixed non-transitory instructions are stored. The RAM 870 and the disk drive 880 may include a file storage subsystem providing persistent (non-volatile) storage for program and data files. The RAM 870 and the disk drive 880 may also include removable storage systems, such as removable flash memory.

The bus subsystem 890 provides a mechanism for letting the various components and subsystems of the computer 820 communicate with each other as intended. Although the bus subsystem 890 is shown schematically as a single bus, alternative embodiments of the bus subsystem may utilize multiple busses.

FIG. 8 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors; Opteron™ or AthlonXP™ microprocessors from Advanced Micro Devices, Inc; and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A method implemented on a computer system to output data from superblocks of a memory that comprises a plurality of memory dies, the method comprising:
   decoding, in a decoding iteration, codewords from a superblock of the memory, wherein the superblock comprises a first block on a first memory die, a second block on a second memory die, and a third block on a third memory die, wherein the first block stores a first codeword of the codewords, wherein the second block stores a second codeword of the codewords, and wherein the third block stores XOR parity bits for the codewords;
   determining that the decoding of at least the first codeword and the second codeword failed in the decoding iteration based on a first number of error bits associated with the first codeword and on a second number of error bits associated with the second codeword, wherein the decoding of the first codeword in the decoding iteration is based on first soft information associated with the first codeword, and wherein the decoding of the second codeword in the decoding iteration is based on second soft information associated with the second codeword;
   selecting to decode, in a next decoding iteration, the first codeword prior to decoding the second codeword in the next decoding iteration based on the first number of error bits and the second number of error bits;
   generating, based on the first codeword being selected, updated first soft information associated with the first codeword, wherein the updated first soft information is generated by updating the first soft information based on the second soft information and the XOR parity bits; and
   decoding, in the next decoding iteration, the first codeword based on the updated first soft information.

2. The method of claim 1, further comprising:
   determining that the first number of error bits has decreased from the decoding iteration based on the decoding of the first codeword in the next decoding iteration;
   accessing soft information associated with the first codeword and available upon the decoding in the next decoding iteration;
   generating updated second soft information associated with the second codeword by updating the second soft information based on the soft information associated with the first codeword and on the XOR parity bits; and
   decoding, in the next decoding iteration, the second codeword based on the updated second soft information.

3. The method of claim 2, wherein the first codeword is a low-density parity-check (LDPC) codeword, and wherein a decrease of the first number of error bits is indicated based on a decrease to a number of unsatisfied check nodes associated with the decoding of the LDPC codeword between the decoding iteration and the next decoding iteration.

4. The method of claim 1, further comprising:
   determining that the first number of error bits has increased from the decoding iteration based on the decoding of the first codeword in the next decoding iteration;
   generating updated second soft information associated with the second codeword by updating the second soft information based on the XOR parity bits and independently of soft information associated with the first codeword from the next decoding iteration; and
   decoding, in the next decoding iteration, the second codeword based on the updated second soft information.

5. The method of claim 1, further comprising:
   determining whether the decoding of the first codeword in the next decoding iteration corresponds to a decoding convergence or a decoding divergence; and
   decoding, in the next decoding iteration, the second codeword depending on whether the decoding convergence or the decoding divergence is determined.

6. The method of claim 5, wherein the decoding convergence is determined based on a determination that the first number of error bits decreased from the decoding iteration.

7. The method of claim 5, wherein the decoding divergence is determined based on a determination that the first number of error bits increased from the decoding iteration, and further comprising:
   erasing soft information associated with the first codeword and available upon the decoding of the first codeword in the next decoding iteration.

8. The method of claim 1, further comprising:
   ranking the first codeword and the second codeword based on the first number of error bits and the second number of error bits from the decoding iteration; and
   scheduling the decoding, in the next decoding iteration, of the first codeword and the second codeword based on the ranking.

9. The method of claim 1, wherein the first soft information is updated based on information about the XOR parity bits, and wherein the information about the XOR parity bits comprises log likelihood ratios.

10. The method of claim 1, wherein the first soft information is updated based on information about the XOR parity bits, and wherein the information about the XOR parity bits comprises hard information.

11. A computer system comprising:
   a processor; and
   a memory comprising computer-readable instructions that, upon execution by the processor, cause the computer system to:
      decode, in a decoding iteration, codewords from a superblock, wherein the superblock comprises a first block on a first memory die, a second block on a second memory die, and a third block on a third memory die, wherein the first block stores a first codeword of the codewords, wherein the second block stores a second codeword of the codewords, and wherein the third block stores XOR parity bits for the codewords;
      determine that the decoding of at least the first codeword and the second codeword failed in the decoding iteration based on a first number of error bits associated with the first codeword and on a second number of error bits associated with the second codeword, wherein the decoding of the first codeword in the decoding iteration is based on first soft information associated with the first codeword, and wherein the decoding of the second codeword in the decoding iteration is based on second soft information associated with the second codeword;
      select to decode, in a next decoding iteration, the first codeword prior to decoding the second codeword in the next decoding iteration based on the first number of error bits and the second number of error bits;
      generate, based on the first codeword being selected, updated first soft information associated with the first codeword, wherein the updated first soft information is generated by updating the first soft information based on the second soft information and the XOR parity bits; and
      decode, in the next decoding iteration, the first codeword based on the updated first soft information.

12. The computer system of claim 11, wherein the superblock comprises wordlines, and wherein the codewords belong to same stripe of the wordlines.

13. The computer system of claim 11, wherein the computer-readable instructions further cause the computer system to:
   determine that the first number of error bits has decreased from the decoding iteration based on the decoding of the first codeword in the next decoding iteration;
   access soft information associated with the first codeword and available upon the decoding in the next decoding iteration;
   generate updated second soft information associated with the second codeword by updating the second soft information based on the soft information associated with the first codeword and on the XOR parity bits; and
   decode, in the next decoding iteration, the second codeword based on the updated second soft information.

14. The computer system of claim 13, wherein the first codeword is a low-density parity-check (LDPC) codeword, and wherein a decrease of the first number of error bits is indicated based on a decrease to a number of unsatisfied check nodes associated with the decoding of the LDPC codeword between the decoding iteration and the next decoding iteration.

15. The computer system of claim 11, wherein the computer-readable instructions further cause the computer system to:
   determine that the first number of error bits has increased from the decoding iteration based on the decoding of the first codeword in the next decoding iteration;
   generate updated second soft information associated with the second codeword by updating the second soft information based on the XOR parity bits and independently of soft information associated with the first codeword from the next decoding iteration; and
   decode, in the next decoding iteration, the second codeword based on the updated second soft information.

16. One or more non-transitory computer storage media comprising instructions that, upon execution on a computer system, configure the computer system to perform operations comprising:
   decoding, in a decoding iteration, codewords from a superblock, wherein the superblock comprises a first block on a first memory die, a second block on a second memory die, and a third block on a third memory die, wherein the first block stores a first codeword of the codewords, wherein the second block stores a second codeword of the codewords, and wherein the third block stores XOR parity bits for the codewords;
   determining that the decoding of at least the first codeword and the second codeword failed in the decoding iteration based on a first number of error bits associated with the first codeword and on a second number of error bits associated with the second codeword, wherein the decoding of the first codeword in the decoding iteration is based on first soft information associated with the first codeword, and wherein the decoding of the second codeword in the decoding iteration is based on second soft information associated with the second codeword;
   selecting to decode, in a next decoding iteration, the first codeword prior to decoding the second codeword in the next decoding iteration based on the first number of error bits and the second number of error bits;
   generating, based on the first codeword being selected, updated first soft information associated with the first codeword, wherein the updated first soft information is generated by updating the first soft information based on the second soft information and the XOR parity bits; and
   decoding, in the next decoding iteration, the first codeword based on the updated first soft information.

17. The one or more non-transitory computer storage media of claim 16, wherein the operations further comprise:
   determining whether the decoding of the first codeword in the next decoding iteration corresponds to a decoding convergence or a decoding divergence; and
   decoding, in the next decoding iteration, the second codeword depending on whether the decoding convergence or the decoding divergence is determined.

18. The one or more non-transitory computer storage media of claim 17, wherein the decoding convergence is determined based on a determination that the first number of error bits decreased from the decoding iteration.

19. The one or more non-transitory computer storage media of claim 17, wherein the decoding divergence is determined based on a determination that the first number of error bits increased from the decoding iteration, and wherein the operations further comprise:
   erasing soft information associated with the first codeword and available upon the decoding of the first codeword in the next decoding iteration.

20. The one or more non-transitory computer storage media of claim 16, wherein the operations further comprise:
   ranking the first codeword and the second codeword based on the first number of error bits and the second number of error bits from the decoding iteration; and
   scheduling the decoding, in the next decoding iteration, of the first codeword and the second codeword based on the ranking.

\* \* \* \* \*